Aug. 28, 1956 B. H. TONGUE 2,761,023

WIDE-BAND NEUTRALIZED RADIO FREQUENCY AMPLIFIER

Filed Sept. 29, 1954

INVENTOR.
BEN H. TONGUE

BY Rines and Rines

ATTORNEYS

United States Patent Office 2,761,023

Patented Aug. 28, 1956

2,761,023

WIDE-BAND NEUTRALIZED RADIO FREQUENCY AMPLIFIER

Ben H. Tongue, Westfield, N. J.

Application September 29, 1954, Serial No. 459,145

10 Claims. (Cl. 179—171)

Figure 1:
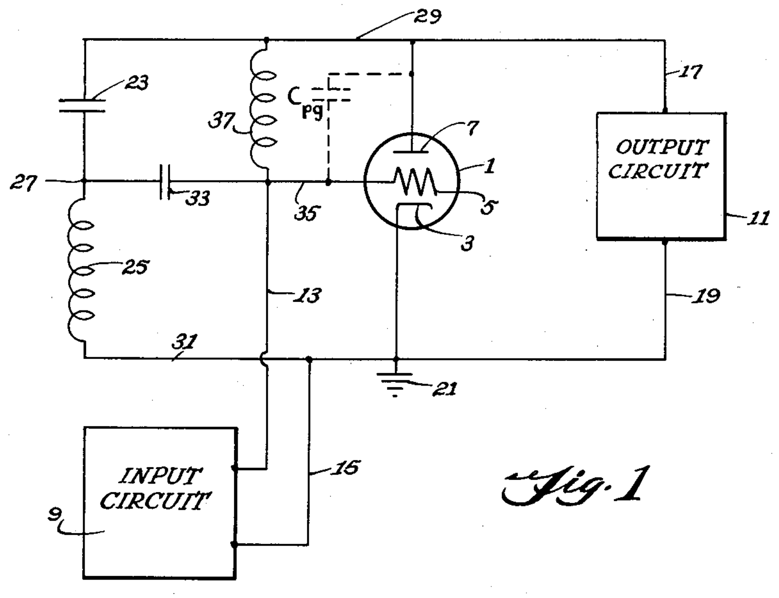

The present invention relates to radio-frequency amplifiers and more particularly to vacuum-tube or electron-tube amplifiers embodying neutralizing apparatus.

Various types of circuits and networks have been proposed for neutralizing undesired feed-back effects in radio-frequency amplifiers, such as voltages fed back from the output to the input of an electron-tube amplifier through interelectrode capacitances. In general, the operation of such neutralizing circuits and networks is based upon the development of a voltage that is of the same magnitude but of opposed phase to that of the undesired feed-back voltage in order to cancel out the effect of the same. The problem of providing such neutralization over wide frequency bands has been attacked through the use of compromise arrangements of compensating circuits and networks. As an illustration, in grounded-grid triode amplifiers and grounded-cathode tetrode amplifiers it has been proposed to neutralize feedback effects caused by interelectrode capacitance between each of two electrodes and a common third electrode having inherent inductance as well, by a two-terminal network connected between the said two electrodes that presents a capacitive reactance over the band of frequencies over which the amplifiers are to operate.

These neutralization proposals, however, are unsatisfactory in the particular case of a triode amplifier having a grounded cathode. In such an amplifier, unlike the grounded-grid triode or the grounded-cathode tetrode, before mentioned, the interelectrode capacitance between an input electrode and ground or between an output electrode and ground and any inherent inductance associated with the grounded electrode are of no appreciable significance. Whereas there is no appreciable output-to-input interelectrode capacitance coupling in the grounded-grid triode or the grounded-cathode tetrode, since the grounded grid of the former and the screen grid of the latter shield the plate from the cathode and the control grid, respectively, in the case of the grounded-cathode triode, on the other hand, or a multi-electrode tube operated in an equivalent manner to a grounded-cathode triode, there is a large controlling plate-to-control grid capacitance. This necessitates an entirely different type of neutralizing apparatus than can be used in the above-mentioned prior-art systems, particularly if wide-band high-frequency neutralization is to be achieved.

An object of the present invention is to provide a new and improved wide-band high-frequency neutralized grounded-cathode triode amplifier, or other multi-electrode amplifier operated in a manner equivalent to a grounded-cathode triode. In summary, the present invention embodies a first feed-back path comprising a first external capacitor connected in series with a first external inductor between the plate and ground and in series circuit with a second external capacitor between the plate and the control electrode, and a second feed-back path comprising a second external inductor connected between the plate and the control electrode in parallel with the plate-to-control grid interelectrode capacitance. The second feed-back path is tuned to a frequency below the lowest frequency of the band of frequencies with which the amplifier is to operate. The impedance of the first inductor at frequencies within the upper end of the said band is adjusted to be small compared with the impedance of each of the first and second capacitors of the first feed-back path.

An additional object is to provide a novel neutralization circuit.

Other and further objects will be explained hereinafter and will be more particularly pointed out in the appended claims.

Figure 2:
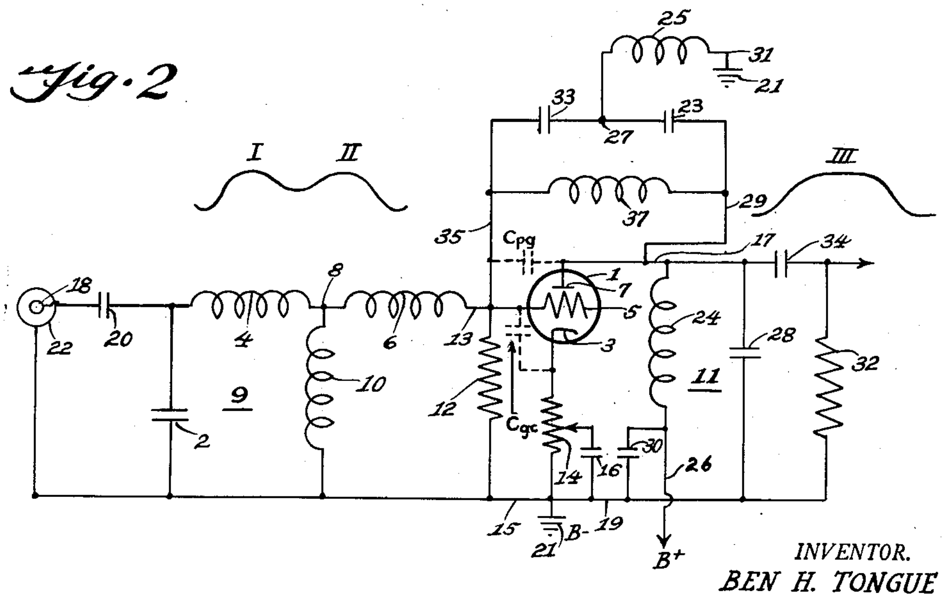

The invention will now be explained in connection with the accompanying drawing Fig. 1 of which is a generalized circuit diagram of the invention; and Fig. 2 is a circuit diagram of a preferred embodiment thereof.

A triode vacuum-tube or electron-tube amplifier 1 is shown in Fig. 1 provided with a cathode electrode 3, an anode or plate electrode 7 and a control-grid electrode 5 spaced between the cathode 3 and the plate 7. Since the tube 1 may be used in any desired type of amplifier circuit, the input circuit 9 connected by conductors 13 and 15 between the control electrode 5 and the cathode 3, and the output circuit 11, connected by conductors 17 and 19 between the plate 7 and the cathode 3, are shown in schematic block-diagram form. These blocks may, for example, comprise tuned radio-frequency tank circuits or any other desired amplifying circuit configurations. The cathode 3 is shown connected to ground at 21. The term "ground," as used in the specification and the claims hereof, is intended to connote not only actual earthing, but also chassis or other reference potential.

As before stated, when such amplifier circuit is employed to amplify high radio frequencies, such as, for example, the wide bands of television radio frequencies extending from 54 to 216 megacycles, it has been found that, unlike operation with grounded-grid triodes or grounded-cathode tetrodes, undesirable feed-back takes place principally as a result of output circuit-to-input circuit coupling through the particular interelectrode capacitance $C_{pg}$, shown dotted, between the plate 7 and grid 5 of the tube 1. In a typical grounded-cathode triode so used, the capacitance $C_{pg}$ may be quite large, say of the order of 1½ to 2 micro-microfarads. The interelectrode capacities between the plate 7 and ground and between the control grid 5 and ground and the inherent inductance in the grounded cathode electrode 3 and its lead, on the other hand, while of major importance in such ground-grid triodes and grounded-cathode tetrodes, play negligible feed-back-coupling roles in the circuit of the present invention. The grounded-cathode triode amplifier 1 thus requires no neutralization of these interelectrode capacities and inductances that are of concern in such prior-art amplifiers, but demands, rather, neutralization of the particular large capacity $C_{pg}$. Such neutralization, moreover, must be effected over the wide frequency band before mentioned. Further restrictions peculiar to the circuit of the present invention will subsequently be discussed.

It is now in order to define the before-mentioned pair of external feed-back paths that have been found to solve the problem of permitting such high-frequency wide-band neutralization of a grounded-cathode triode amplifier. The first feed-back path comprises a first external capacitor 23 and a first external inductor or coil 25 connected in series circuit between the plate 7 and ground 21 by conductors 29 and 31. The remainder of the first feed-back path includes a second external capacitor 33 connected from the point 27 of series connection of the capacitor 23 and the inductor 25 by conductor 35 to the control-grid electrode 5. A series circuit may thus also be traced from the output or plate electrode 7 through series-connected capacitors 23 and 33 to the input control-grid electrode 5. The second previously mentioned feed-back path includes a second external inductor or coil 37, the terminals of which are connected by conductor 29 to the plate 7 and by conductor 35 to the control-grid electrode 5. The inductor 37 is thus connected directly in parallel with the capacity $C_{pg}$.

In order for those two feed-back paths 23, 25, 33 and 37, $C_{pg}$ to solve the substantially constant high-frequency wide-band neutralization problem underlying the present invention, however, certain criteria must be satisfied. It has been found that the feed-back path 37, $C_{pg}$, first of all, must be tuned to a frequency below the lowest frequency of the band of frequencies with which the amplifier 1 is to operate. In the previous illustration, the parallel-resonant feed-back circuit 37, $C_{pg}$ must be tuned to a frequency less than about 54 magacycles. Under such circumstances, the impedance of this shunt-resonant circuit 37, $C_{pg}$ has been found appropriately to vary with frequency, always, however, remaining capacitive, to achieve the desired wide band neutralization. It is further necessary that the external capacitors 23 and 33 of the first-named feed-back path be as small as possible so as not to reduce the gain of the amplifier tube 1. Large capacitors 23 and 33 would act to reduce the gain by effectively increasing the plate-to-ground and grid-to-ground capacitances. It has been found preferable, moreover, to make the external capacitors 23 and 33 of about equal value or at least of the same order of magnitude. In the above example, they may have a value of about 1½ micromicrofarads.

It has also been found necessary that the inductor 25 present a much lower impedance to frequencies at the high or upper end of the frequency band than either of capacitors 23 and 33. In accordance with the present invention, therefore, the inductance 25 is adjusted to provide neutralization at the upper end of the band through adjusting its impedance in, say, the 190–216 megacycle region, to present an impedance low compared with that of capacitors 23 and 33. The value of the inductance 25, however, will be much greater than any inherent inductance in the electrodes of the tube 1 or the leads thereto.

A preferred embodiment of the invention is illustrated in Fig. 2 where the input circuit 9 comprises a shunt-capacitance 2 and two series-connected inductances 4 and 6, the point 8 of series connection of which is connected to the conductor 15 by a shunt inductance 10. Connected between the input conductors 13 and 15 is a resistance 12 of value substantially equal to the impedance presented by the part of the input circuit to the left thereof and which, in effect, is in parallel with the grid-to-cathode capacitance $C_{gc}$ and any cathode resistance 14 that may be employed. All or part only of the cathode resistance may be decoupled to ground 21 by a by-pass capacitor 16, depending upon the desired degree of degeneration. The input circuit 9 may be fed radio-frequency energy from a transmission line such as, for example, a coaxial antenna transmission line the inner conductor 18 of which is connected through an impedance-transforming capacitance 20 to the inductance 4, and the outer conductor 22 of which is connected to ground at 21. The coaxial line 18, 22, as an illustration, may be connected to feed television signal frequencies in the low 54 to 88 or the high 174 to 216 megacycle bands. The input circuit 9 will be recognized as of the multiply-peaked type, in this case, for example, a double-tuned network with the aid of which advantageous matching and other desirable features can be attained. The circuit 9 is broadly peaked at a pair of frequencies I and II which may be about 58 and 84 megacycles in the low television band or about 180 and 210 megacycles in the high television band, before mentioned. In such event, in accordance with the present invention, the shunt-resonant feedback path 37, $C_{pg}$ will be tuned to a frequency less than peak I, namely, less than about 58 megacycles or less than about 180 megacycles in the examples above-presented. The impedance of the inductor 25, moreover, will, in accordance with the invention, be adjusted to present an impedance low compared to that of capacitors 23 and 33 at the upper end of the respective bands.

The output circuit of Fig. 2 comprises a broad-band resonant single-tuned network comprising an inductance 24 and a capacitance 28. The inductance 24 is connected to the plate 7 by conductor 17 and to the positive terminal B+ of the plate-supply power source, not shown, by a conductor 26. The conductor 26 is shown by-passed by a condenser 30 to the conductor 19 which is grounded at 21. This ground terminal 21 may also be the negative terminal B— of the above-mentioned power source. The capacitance 28 is connected in parallel with a load resistance 32 through a direct-current blocking capacitor 34, and it may, in practice, assume the form of the input-circuit capacitance and loading of, for example, a grounded-grid triode stage, not shown, following the tube 1 in a cascaded amplifier system. The output circuit 11 is tuned so that its broad resonant response III covers the complete desired band, including the peaks I and II. The broad band III may be either the low or the high television bands in the illustration before-mentioned.

As before stated, any amplifier having a multiplicity of electrodes that is connected to operate in a manner equivalent to a grounded-cathode triode may utilize the techniques of the present invention to achieve wide-band neutralization. Modifications will occur to those skilled in the art and all such are considered to fall within the spirit and scope of the invention as defined in the appended claims.

What is claimed is:

1. A radio-frequency amplifier for amplifying a predetermined band of radio frequencies having, in combination, an electron tube provided with a plurality of spaced electrodes, an input circuit connected to two of the electrodes and an output circuit connected between a third electrode and the one of the said two electrodes that is spaced further from the third electrode in the tube, means for grounding the said one electrode whereby the tube is provided with appreciable interelectrode capacitance between the other of the said two electrodes and the third electrode, a first feed-back path comprising a first capacitor connected in series circuit with a first inductor between the third electrode and ground and in series circuit with a second capacitor between the third electrode and the said other electrode, and a second feed-back path comprising a second inductor connected between the third electrode and the said other electrode in parallel with the said interelectrode capacitance between the said other and third electrodes of the tube, the second feed-back path being tuned to a frequency below the lowest frequency of the said band, and the impedance of the first inductor at frequencies within the upper end of the said band being small compared with the impedance of each of the first and second capacitors of the first feed-back path.

2. A radio-frequency amplifier for amplifying a predetermined band of radio frequencies having, in combination, an electron tube provided with a plurality of spaced electrodes, an input circuit connected to two of the electrodes and an output circuit connected between a third electrode and the one of the said two electrodes that is spaced further from the third electrode in the tube, means for grounding the said one electrode whereby the tube is provided with appreciable interelectrode capacitance between the other of the said two electrodes and the third electrode, a first feed-back path comprising a first capacitor connected external to the tube in series circuit with a first external inductor between the third electrode and ground and in series circuit with a second capacitor external to the tube between the third electrode and the said other electrode, and a second feed-back path comprising a second inductor external to the tube connected between the third electrode and the said other electrode in parallel with the said interelectrode capacitance between the said other and third electrodes of the tube, the second feed-back path being tuned to a frequency below the lowest frequency of the said band, and the impedance of the first inductor at frequencies within the upper end of the said band being small compared with the impedance of each of the first and second capacitors of the first feed-back path.

3. A radio-frequency amplifier for amplifying a predetermined band of radio frequencies having, in combination, an electron tube provided with a grounded cathode, a control electrode and a plate, an input circuit connected to the control electrode and the cathode and an output circuit connected between the plate and the cathode, a first feed-back path comprising a first capacitor connected in series circuit with a first inductor between the plate and ground and in series circuit with a second capacitor between the plate and the control electrode, and a second feed-back path comprising a second inductor connected between the plate and the control electrode in parallel with the grid-to-plate capacitance of the tube, the second feed-back path being tuned to a frequency below the lowest frequency of the said band, and the impedance of the first inductor at frequencies within the upper end of said band being small compared with the impedance of each of the first and second capacitors of the first feed-back path.

4. A radio-frequency amplifier for amplifying a predetermined band of radio frequencies having, in combination, a triode electron tube provided with a grounded cathode, a control electrode and a plate, an input circuit connected to the control electrode and the cathode and an output circuit connected between the plate and the cathode, a first feed-back path comprising a first capacitor connected external to the tube in series circuit with a first external inductor between the plate and ground and in series circuit with a second capacitor external to the tube between the plate and the control electrode, and a second feed-back path comprising a second inductor external to the tube connected between the plate and the control electrode in parallel with the grid-to-plate capacitance of the tube, the second feed-back path being tuned to a frequency below the lowest frequency of the said band, and the impedance of the first inductor at frequencies within the upper end of said band being small compared with the impedance of each of the first and second capacitors of the first feed-back path.

5. A radio-frequency amplifier for amplifying a predetermined band of radio frequencies having, in combination, a triode electron tube provided with a grounded cathode, a control electrode and a plate, an input circuit connected to the control electrode and the cathode and an output circuit connected between the plate and the cathode, a first feed-back path comprising a first capacitor connected external to the tube in series circuit with a first external inductor between the plate and ground and in series circuit with a second capacitor external to the tube between the plate and the control electrode, the first and second capacitors having substantially equal values, and a second feed-back path comprising a second inductor external to the tube connected between the plate and the control electrode in parallel with the grid-to-plate capacitance of the tube, the second feed-back path being tuned to a frequency below the lowest frequency of the said band, and the impedance of the first inductor at frequencies within the upper end of said band being small compared with the impedance of each of the first and second capacitors of the first feed-back path.

6. A radio-frequency amplifier for amplifying a predetermined band of radio frequencies having, in combination, an electron tube provided with a plurality of spaced electrodes, a multi-peaked resonant input circuit having a plurality of resonant peaks within the said predetermined band connected to two of the electrodes and a broad-band single-resonant output circuit the resonant response of which includes the resonant peaks of the input circuit and covers the said predetermined band connected between a third electrode and the one of the said two electrodes that is spaced further from the third electrode in the tube, means for grounding the said one electrode whereby the tube is provided with appreciable interelectrode capacitance between the other of the said two electrodes and the third electrode, a first feed-back path comprising a first capacitor connected in series circuit with a first inductor between the third electrode and ground and in series circuit with a second capacitor between the third electrode and the said other electrode, and a second feed-back path comprising a second inductor connected between the third electrode and the said other electrode in parallel with the said interelectrode capacitance between the said other and third electrodes of the tube, the second feed-back path being tuned to a frequency below the lowest peak-frequency of the multi-peaked resonant input circuit, and the impedance of the first inductor at frequencies within the upper end of the broad single-resonant response of the output circuit being small compared with the impedance of each of the first and second capacitors of the first feed-back path.

7. A radio-frequency amplifier for amplifying a predetermined band of radio frequencies having, in combination, an electron tube provided with a plurality of spaced electrodes, a multi-peaked resonant input circuit having a plurality of resonant peaks within the said predetermined band connected to two of the electrodes and a broad-band single-resonant output circuit the resonant response of which includes the resonant peaks of the input circuit and covers the said predetermined band connected between a third electrode and the one of the said two electrodes that is spaced further from the third electrode in the tube, means for grounding the said one electrode whereby the tube is provided with appreciable interelectrode capacitance between the other of the said two electrodes and the third electrode, a first feed-back path comprising a first capacitor connected external to the tube in series circuit with a first external inductor between the third electrode and ground and in series circuit with a second capacitor external to the tube between the third electrode and the said other electrode, and a second feed-back path comprising a second inductor external to the tube connected between the third electrode and the said other electrode in parallel with the said interelectrode capacitance between the said other and third electrodes of the tube, the second feed-back path being tuned to a frequency below the lowest peak-frequency of the multi-peaked resonant input circuit, and the impedance of the firt inductor at frequencies within the upper end of the broad single-resonant response of the output circuit being small compared with the impedance of each of the first and second capacitors of the first feed-back path.

8. A radio-frequency amplifier for amplifying a predetermined band of radio frequencies having, in combination, an electron tube provided with a grounded cathode, a control electrode and a plate, a multi-peaked resonant input circuit having a plurality of resonant peaks within the said predetermined band connected to the control electrode and the cathode and a broad-band single-resonant output circuit the resonant response of which includes the resonant peaks of the input circuit and covers the said predetermined band connected between the plate and the cathode, a first feed-back path comprising a first capacitor connected in series circuit with a first inductor between the plate and ground and in series circuit with a second capacitor between the plate and the control electrode, and a second feed-back path comprising a second inductor connected between the plate and the control electrode in parallel with the grid-to-plate capacitance of the tube, the second feed-back path being tuned to a frequency below the lowest peak frequency of the multi-peaked resonant input circuit, and the impedance of the first inductor at frequencies within the broad single-resonant response of the output circuit being small compared with the impedance of each of the first and second capacitors of the first feed-back path.

9. A radio-frequency amplifier for amplifying a predetermined band of radio frequencies having, in combination, a triode electron tube provided with a grounded cathode, a control electrode and a plate, a double-peaked resonant input circuit having a pair of resonant peaks within the said predetermined band connected to the control electrode and the cathode and a broad-band single-resonant output circuit the resonant response of which includes the pair of resonant peaks of the input circuit and covers the said predetermined band connected between the plate and the cathode, a first feed-back path comprising a first capacitor connected external to the tube in series circuit with a first external inductor between the plate and ground and in series circuit with a second capacitor external to the tube between the plate and the control electrode, and a second feed-back path comprising a second inductor external to the tube connected between the plate and the control electrode in parallel with the grid-to-plate capacitance of the tube, the second feed-back path being tuned to a frequency below the lower peak-frequency of the double-peaked resonant input circuit, and the impedance of the first inductor at frequencies within the broad single-resonant response of the output circuit being small compared with the impedance of each of the first and second capacitors of the first feed-back path.

10. A radio-frequency amplifier for amplifying a predetermined band of radio frequencies having, in combination, a triode electron tube provided with a grounded cathode, a control electrode and a plate, a double-peaked resonant input circuit having a pair of resonant peaks within the said predetermined band connected to the control electrode and the cathode and a broad single-resonant output circuit the resonant response of which includes the pair of resonant peaks of the input circuit and covers the said predetermined band connected between the plate and the cathode, a first feed-back path comprising a first capacitor connected external to the tube in series circuit with a first external inductor between the plate and ground and in series circuit with a second capacitor external to the tube between the plate and the control electrode, the first and second capacitors having substantially equal values, and a second feed-back path comprising a second inductor external to the tube connected between the plate and the control electrode in parallel with the grid-to-plate capacitance of the tube, the second feed-back path being tuned to a frequency below the lower peak-frequency of the double-peaked resonant input circuit, and the impedance of the first inductor at frequencies within the broad single-resonant response of the output circuit being small compared with the impedance of each of the first and second capacitors of the first feed-back path.

References Cited in the file of this patent

UNITED STATES PATENTS

| | | |
|---|---|---|
| 1,770,524 | Jones | July 15, 1930 |
| 1,770,525 | Jones | July 15, 1930 |
| 2,344,734 | Roberts | Mar. 21, 1944 |
| 2,691,078 | Gluyas | Oct. 5, 1954 |